(12) United States Patent
Saito et al.

(10) Patent No.: US 8,598,599 B2
(45) Date of Patent: Dec. 3, 2013

(54) GROUP III NITRIDE SEMICONDUCTOR LIGHT-EMITTING DEVICE

(75) Inventors: Yoshiki Saito, Kiyosu (JP); Koji Okuno, Kiyosu (JP); Yasuhisa Ushida, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 154 days.

(21) Appl. No.: 13/064,454

(22) Filed: Mar. 25, 2011

(65) Prior Publication Data
US 2011/0240956 A1 Oct. 6, 2011

(30) Foreign Application Priority Data
Mar. 30, 2010 (JP) .................. 2010-079192

(51) Int. Cl.
*H01L 33/00* (2010.01)

(52) U.S. Cl.
USPC ...... 257/79; 257/102; 257/103; 257/E33.003; 257/E33.025; 257/E33.028; 257/E33.029; 257/E33.03; 257/E33.033; 257/E33.055; 257/E33.067; 257/E33.074; 438/22; 438/29; 438/31; 438/32

(58) Field of Classification Search
USPC ............ 257/79, E33.003, 102, 103, E33.025, 257/E33.028–E33.03, E33.033, E33.055, 257/E33.067, E33.074; 438/22, 29, 31, 32
See application file for complete search history.

(56) References Cited

U.S. PATENT DOCUMENTS

| 6,555,403 B1 * | 4/2003 | Domen et al. .................. 438/22 |
| 7,339,195 B2 | 3/2008 | Goto et al. |
| 7,439,546 B2 | 10/2008 | Goto et al. |
| 7,830,930 B2 | 11/2010 | Tanaka |
| 7,964,419 B2 | 6/2011 | Goto et al. |
| 7,973,322 B2 | 7/2011 | Akita et al. |
| 2001/0024722 A1 * | 9/2001 | Matsuhisa et al. ............. 428/364 |

(Continued)

FOREIGN PATENT DOCUMENTS

| JP | 2002-261395(A) | 9/2002 |
| JP | 2006-036561 | 2/2006 |

(Continued)

OTHER PUBLICATIONS

Japanese Office Action dated Mar. 19, 2013 with partial English translation thereof.

(Continued)

*Primary Examiner* — Kenneth Parker
*Assistant Examiner* — John Lin
(74) *Attorney, Agent, or Firm* — McGinn IP Law Group, PLLC

(57) ABSTRACT

The present invention provides a Group III nitride semiconductor light-emitting device whose main surface is a plane which provides an internal electric field of zero, and which exhibits improved emission performance. The light-emitting device includes a sapphire substrate which has, in a surface thereof, a plurality of dents which are arranged in a stripe pattern as viewed from above; an n-contact layer formed on the dented surface of the sapphire substrate; a light-emitting layer formed on the n-contact layer; an electron blocking layer formed on the light-emitting layer; a p-contact layer formed on the electron blocking layer; a p-electrode; and an n-electrode. The electron blocking layer has a thickness of 2 to 8 nm and is formed of Mg-doped AlGaN having an Al compositional proportion of 20 to 30%.

17 Claims, 3 Drawing Sheets

(56) References Cited

U.S. PATENT DOCUMENTS

| | | |
|---|---|---|
| 2004/0056259 A1 | 3/2004 | Goto et al. |
| 2006/0273326 A1 | 12/2006 | Goto et al. |
| 2008/0108160 A1 | 5/2008 | Goto et al. |
| 2008/0112452 A1 | 5/2008 | Chakraborty et al. |
| 2009/0008648 A1 | 1/2009 | Biwa et al. |
| 2009/0067464 A1 | 3/2009 | Tanaka |
| 2009/0310640 A1 | 12/2009 | Sato et al. |
| 2010/0059759 A1 | 3/2010 | Akita et al. |
| 2011/0183452 A1 | 7/2011 | Goto et al. |

FOREIGN PATENT DOCUMENTS

| | | |
|---|---|---|
| JP | 2008-109066 | 5/2008 |
| JP | 2008-277539(A) | 11/2008 |
| JP | 2009-16467(A) | 1/2009 |
| JP | 2009-21361(A) | 1/2009 |
| JP | 2009/59974(A) | 3/2009 |
| JP | 2009-64886(A) | 3/2009 |
| JP | 2011-517099(A) | 5/2011 |
| WO | WO 02/054549 A1 | 7/2002 |
| WO | WO 2009/008202 A1 | 1/2009 |
| WO | WO 2009/111790 A1 | 9/2009 |
| WO | 2009/124317 A2 | 10/2009 |
| WO | 2009/124317 A3 | 10/2009 |

OTHER PUBLICATIONS

First Office Action dated Jan. 10, 2013 in Chinese Application No. 201110081860.9.

* cited by examiner

GROUP III NITRIDE SEMICONDUCTOR LIGHT-EMITTING DEVICE

BACKGROUND OF THE INVENTION

1. Field of the Invention

The present invention relates to a Group III nitride semiconductor light-emitting device whose main surface is a plane which provides an internal electric field of zero; i.e., a plane which is inclined by 90° with respect to c-plane (e.g., m-plane or a-plane), or a plane which is inclined by about 60° with respect to c-plane.

2. Background Art

Conventionally, Group III nitride semiconductor light-emitting devices are employ as a main surface a c-plane of Group III nitride semiconductor. In such a light-emitting device, an internal electric field is generated in semiconductor crystals due to piezopolarization caused by strain in a crystal structure, which may cause problems, including reduction of emission performance and deterioration of crystallinity. Thus, in recent years, attempts have been made to produce a Group III nitride semiconductor light-emitting device whose main surface is a plane which provides an internal electric field of zero (e.g., m-plane or a-plane). Such a Group III nitride semiconductor light-emitting device having an m-plane or a-plane main surface is particularly suitable for use in, for example, a backlight of a liquid crystal panel, since the light emitted from the device is polarized in a specific direction.

Japanese Patent Application Laid-Open (kokai) No. 2008-109066 discloses a Group III nitride semiconductor light-emitting device whose main surface is a non-polar plane or a semi-polar plane, wherein an electron blocking layer is provided between a light-emitting layer having an MQW structure and a p-contact layer, and the electron blocking layer has a thickness of 28 nm and is formed of Mg-doped AlGaN. The electron blocking layer is provided for preventing flow of electrons to a p-type layer, whereby more effective electron flow to the light-emitting layer can be attained, resulting in improvement of emission performance.

Japanese Patent Application Laid-Open (kokai) No. 2006-36561 discloses a method for forming a Group III nitride semiconductor layer whose main surface is a plane of interest, the method employing an embossed sapphire substrate as a growth substrate.

Since In is less likely to be incorporated into a Group III nitride semiconductor layer whose main surface is a plane which provides an internal electric field of zero, optimal conditions for improving the emission performance of a Group III nitride semiconductor light-emitting device whose main surface is a plane which provides an internal electric field of zero are different from those for improving the emission performance of a conventional Group III nitride semiconductor light-emitting device having a c-plane main surface. The same also applies to an electron blocking layer formed on a light-emitting layer. However, hitherto, detailed studies have not yet been conducted on the optimal structure of an electron blocking layer whose main surface is a plane which provides an internal electric field of zero.

SUMMARY OF THE INVENTION

In view of the foregoing, an object of the present invention is to improve the emission performance of a Group III nitride semiconductor light-emitting device whose main surface is a plane which provides an internal electric field of zero by optimizing the structure of an electron blocking layer.

A first aspect of the present invention provides a Group III nitride semiconductor light-emitting device having a stacked structure comprising an n-contact layer, a light-emitting layer, an electron blocking layer, and a p-contact layer, the layers being sequentially stacked and each of the layers being a Group III nitride semiconductor layer whose main surface represents a plane which provides an internal electric field intensity of 10% or less that of a Group III nitride semiconductor layer having a c-plane main surface, wherein the electron blocking layer has a thickness of 2 to 8 nm and is formed of Mg-doped AlGaN having an Al compositional proportion of 15 to 35 mol %. Hereinafter the denote of % means mol %.

As used herein, "Group III nitride semiconductor" encompasses a semiconductor represented by the formula $Al_xGa_yIn_zN$ ($x+y+z=1$, $0 \leq x, y, z \leq 1$); such a semiconductor in which a portion of Al, Ga, or In is substituted by another Group 13 element (i.e., B or Tl), or a portion of N is substituted by another Group 15 element (i.e., P, As, Sb, or Bi). Specific examples of the Group III nitride semiconductor include those containing at least Ga, such as GaN, InGaN, AlGaN, and AlGaInN. Generally, Si is used as an n-type impurity, and Mg is used as a p-type impurity.

As used herein, "plane which provides an internal electric field intensity of 10% or less that of a Group III nitride semiconductor layer having a c-plane main surface" (hereinafter the plane may be referred to as a "polarless plane") refers to a plane which is inclined by 5° or less with respect to a non-polar plane (e.g., m-plane or a-plane) which is inclined by 90° with respect to c-plane of a Group III nitride semiconductor, or a semi-polar plane (e.g., (11-22) plane) which is inclined by about 60° with respect to c-plane of the semiconductor. The most preferred plane is a plane which provides an internal electric field of zero; i.e., m-plane, a-plane, or a plane which is inclined by about 60° with respect to c-plane. As used herein, the bar line which is conventionally provided above a component of a Miller index is denoted by the symbol "-" provided immediately before the component. The present invention employs a Group III nitride semiconductor having an internal electric field intensity of 10% or less that of a Group III nitride semiconductor layer having a c-plane main surface. The reason for this is that when the internal electric field intensity falls within such a range, emission performance is substantially not reduced, and shift of emission wavelength to a longer wavelength can be prevented.

For further improvement of emission performance, the electron blocking layer more preferably has the below-described Mg content, Al compositional proportion, and thickness. The electron blocking layer preferably has an Mg content of $1 \times 10^{19}$ to $1 \times 10^{20}$ cm$^{-3}$. The electron blocking layer more preferably has an Al compositional proportion of 20 to 30%. The electron blocking layer most preferably has a thickness of 4 to 6 nm.

The n-contact layer or the p-contact layer may be a single layer or may be formed of a plurality of layers. An n-cladding layer may be provided between the n-contact layer and the light-emitting layer, and an ESD layer may also be provided between the n-contact layer and the n-cladding layer for the purpose of improving breakdown voltage. A p-cladding layer may be provided between the electron blocking layer and the p-contact layer. These n-cladding layer, ESD layer, and p-cladding layer may have a structure employed in a conventional Group III nitride semiconductor light-emitting device having a c-plane main surface.

The Group III nitride semiconductor light-emitting device of the present invention may have a configuration in which a portion of the surface of the p-contact layer is etched such that the n-contact layer is exposed, and an n-electrode is provided on the exposed n-contact layer such that the n-electrode and a p-electrode are on the same side of the device; or a configuration in which an n-electrode is provided so as to face a p-electrode in a direction perpendicular to the main surface of the device by, for example, using a conductive substrate as a growth substrate or removing the growth substrate after formation of a semiconductor wafer, such that electrical conduction is achieved between the n-electrode and the p-electrode in a direction perpendicular to the main surface of the device.

A second aspect of the present invention is drawn to a specific embodiment of the Group III nitride semiconductor light-emitting device according to the first aspect of the invention, wherein the electron blocking layer has a thickness of 4 to 6 nm.

A third aspect of the present invention is drawn to a specific embodiment of the Group III nitride semiconductor light-emitting device according to the first or second aspect of the invention, which has a sapphire substrate having one embossed surface, wherein the stacked structure is provided on the embossed surface of the sapphire substrate.

A fourth aspect of the present invention is drawn to a specific embodiment of the Group III nitride semiconductor light-emitting device according to any of the first to third aspects of the invention, wherein the plane which provides an internal electric field intensity of 10% or less that of a Group III nitride semiconductor layer having a c-plane main surface is a plane which is inclined by 5° or less with respect to m-plane, a-plane, or a plane inclined by 60° with respect to c-plane.

According to the present invention, since the electron blocking layer is configured as described above, the Group III nitride semiconductor light-emitting device whose main surface is a plane which provides an internal electric field intensity of 10% or less that of a Group III nitride semiconductor layer having a c-plane main surface exhibits improved emission performance.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiment.

Embodiment 1

Figure 1:
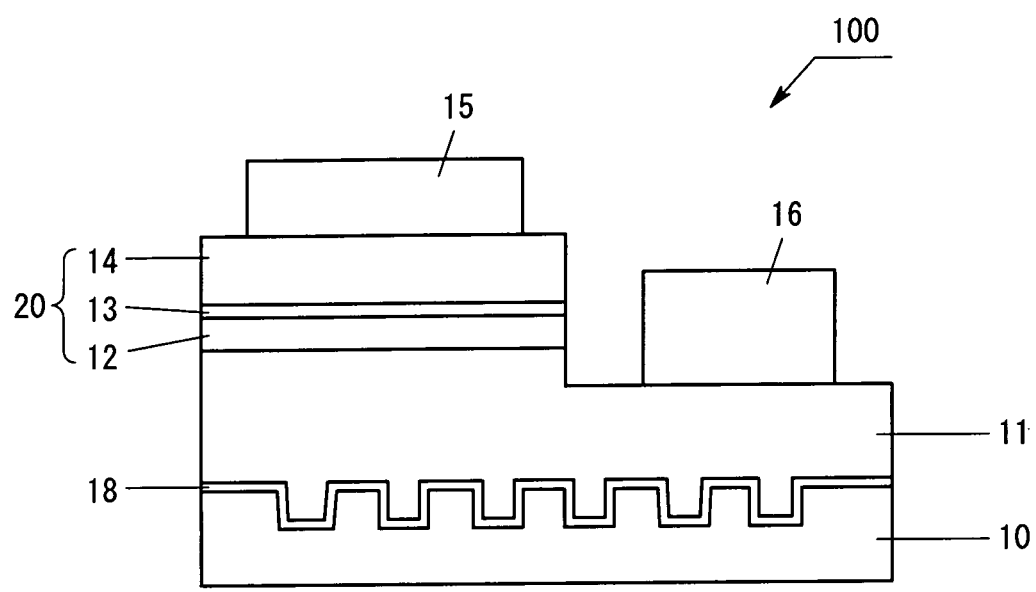
FIG. 1 shows the configuration of a light-emitting device 100 according to Embodiment 1.

FIG. 1 shows the configuration of a light-emitting device 100 according to Embodiment 1. As shown in FIG. 1, the light-emitting device 100 includes a sapphire substrate 10; an n-contact layer 11 formed of n-GaN and deposited on the sapphire substrate 10; a light-emitting layer 12 having an MQW structure and deposited on the n-contact layer 11; an electron blocking layer 13 deposited on the light-emitting layer 12; a p-contact layer 14 deposited on the electron blocking layer 13; a p-electrode 15; and an n-electrode 16. The sapphire substrate 10 has an a-plane main surface, and a Group III nitride semiconductor stacked structure 20 (including the n-contact layer 11, the light-emitting layer 12, the electron blocking layer 13, and the p-contact layer 14) deposited on the sapphire substrate 10 has an m-plane main surface.

The sapphire substrate 10 is a substrate having an a-plane main surface. The sapphire substrate 10 has, in one surface thereof, a plurality of dents 17 which are arranged in a stripe pattern as viewed from above. The bottom surface of each dent 17 is parallel to the main surface of the sapphire substrate 10, and each dent 17 has a rectangular or trapezoidal cross section as viewed in a direction perpendicular to the longitudinal direction of the dent. The longitudinal direction of each dent 17 corresponds to the m-axis direction of the sapphire substrate 10.

The n-contact layer 11 is formed of n-GaN and has an Si content of $2\times10^{19}$ to $2\times10^{20}$ cm$^{-3}$ and a thickness of 3 to 8 μm. The n-contact layer 11 may be formed of a plurality of layers having different Si contents, or may be formed of a layer in which the Si content changes continuously.

The light-emitting layer 12 has an MQW structure in which three well layers formed of undoped InGaN and three barrier layers formed of GaN are alternately deposited.

The electron blocking layer 13 has a thickness of 2 to 8 nm and is formed of AlGaN having an Al compositional proportion of 20 to 30%, and an Mg content of 6 to $8\times10^{19}$ cm$^{-3}$. When the thickness is less than 2 nm, the effect of preventing flow of electrons to the p-contact layer 14 is lowered, and emission performance is deteriorated, which is not preferred. In contrast, when the thickness is greater than 8 nm, crystal quality is lowered, which is not preferred.

In the case of a conventional Group III nitride semiconductor light-emitting device having a c-plane main surface, the thickness of an electron blocking layer must be increased to such a high level as to sufficiently prevent flow of electrons to a p-type layer, since the device is greatly affected by internal electric field (piezoelectric field). Also, from the viewpoint of reducing strain from the p-type layer to lower the effect of internal electric field, the thickness of the electron blocking layer must be increased to a sufficient level. In contrast, in the case of the light-emitting device 100 according to Embodiment 1 having an m-plane main surface, the thickness of the electron blocking layer 13 is not necessarily increased, since the device is less affected by internal electric field. As described above, the thickness of the electron blocking layer 13 suitable for improving emission performance is 2 to 8 nm, which is different from the thickness of the electron blocking layer of the conventional Group III nitride semiconductor light-emitting device having a c-plane main surface.

The p-contact layer 14 has a thickness of 40 to 100 nm and is formed of p-GaN having an Mg content of $1\times10^{19}$ to $1\times10^{20}$ cm$^{-3}$. The p-contact layer 14 may be formed of a plurality of layers having different Mg contents, or may be formed such that the Mg content of a portion of the layer increases in a continuous or stepwise manner as the distance between the portion and the light-emitting layer 12 increases.

An n-cladding layer may be provided between the re-contact layer 11 and the light-emitting layer 12, and a p-cladding layer may be provided between the electron blocking layer 13 and the p-contact layer 14. Furthermore, an ESD layer may be provided between the n-contact layer 11 and the n-cladding layer so as to enhance electrostatic breakdown voltage.

When the device is of a face-up type, the p-electrode 15 has, for example, a structure including a transparent electrode (e.g., ITO) formed on almost the entire top surface of the p-contact layer 14 and a p-pad electrode formed on the transparent electrode. When the device is of a flip-chip type, the p-electrode 15 is formed of a highly reflective metal film (e.g., Ag alloy) provided on almost the entire top surface of the p-contact layer 14.

A groove is formed at a portion of the surface of the p-contact layer 14 such that the groove has a depth reaching the n-contact layer 11, and the n-electrode 16 is formed on a portion of the n-contact layer 11 exposed through the bottom of the groove. No particular limitation is imposed on the material of the n-electrode 16, so long as it can be in low-resistance contact with an m-plane surface of a Group III nitride semiconductor. The material of the n-electrode 16 may be, for example, Ti/Al.

Thus, since the electron blocking layer 13 is configured as described above, the Group III nitride semiconductor light-emitting device 100 according to Embodiment 1, which has an m-plane main surface, exhibits improved emission performance. For further improvement of emission performance, the electron blocking layer 13 more preferably has the below-described thickness, Al compositional proportion, and Mg content. The layer 13 preferably has a thickness of 4 to 6 nm, most preferably 5 nm. The layer 13 preferably has an Al compositional proportion of 15 to 35%, more preferably 20 to 30%. The layer 13 more preferably has an Mg content of $3\times10^{19}$ to $2\times10^{20}$ cm$^{-3}$.

Next will be described processes for producing the light-emitting device 100 according to Embodiment 1.

Figure 2A:
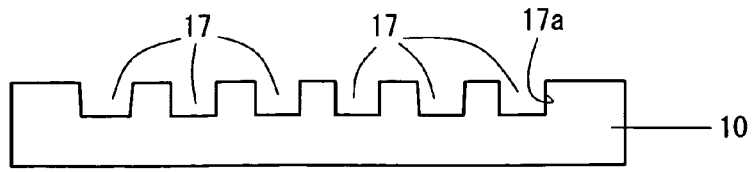
FIGS. 2A to 2F are sketches showing processes for producing the light-emitting device 100 according to Embodiment 1.

Firstly, one surface of the a-plane sapphire substrate 10 is subjected to dry etching, to thereby form a plurality of dents 17 arranged in a stripe pattern as viewed from above. The direction of the stripe pattern corresponds to the m-axis direction of the sapphire substrate 10. The bottom surface of each dent 17 is parallel to the surface of the sapphire substrate 10, and each dent 17 has a rectangular or trapezoidal cross section (FIG. 2A).

Subsequently, the sapphire substrate 10 is heated in a hydrogen atmosphere for thermal cleaning. This cleaning repairs etching damage caused by formation of the dents 17, and also removes impurities or oxides from the surface of the sapphire substrate 10.

Figure 2B:
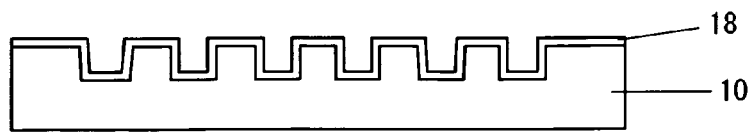

After cooling of the sapphire substrate 10 to 300 to 420° C., TMA (trimethylaluminum) is supplied, and the exposed surface of the sapphire substrate 10 is covered with Al, to thereby form an Al thin film. A gas mixture of hydrogen and nitrogen is employed as a carrier gas. Next, supply of TMA is stopped; the carrier gas and ammonia gas are supplied; and the sapphire substrate 10 is heated to 1,010° C. This process forms an AlN thin film 18 on the sapphire substrate 10 (FIG. 2B). The AlN thin film 18 functions as a buffer layer, promotes GaN crystal growth on side surfaces 17a of the dents 17, and suppresses GaN crystal growth on other surfaces (including the bottom surfaces of the dents 17, and the top surface of the sapphire substrate 10 which has not undergone etching).

Figure 2C:
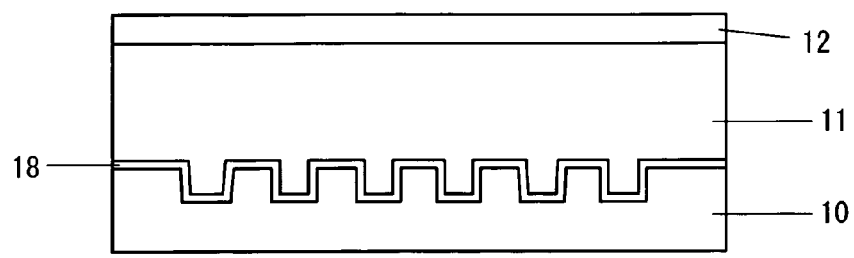

Subsequently, n-GaN crystal is grown through MOCVD. A gas mixture of hydrogen and nitrogen is employed as a carrier gas; ammonia is employed as a nitrogen source; TMG (trimethylgallium) is employed as a Ga source; and silane is employed as an n-type dopant gas. At an initial stage of crystal growth, n-GaN is grown on the side surfaces 17a of the dents 17 via the AlN thin film 18, and growth thereof is suppressed on the other surfaces. The n-GaN crystal is grown parallel to the main surface (i.e., a-plane) of the sapphire substrate 10 and perpendicular to the side surfaces 17a of the dents 17 along a c-axis direction of the n-GaN crystal. A-axis direction of the growing n-GaN crystal coincides with the longitudinal direction of the dents 17, i.e., the m-axis direction of the sapphire substrate 10. As crystal growth proceeds, the entire top surface of the sapphire substrate 10 is gradually covered with n-GaN grown on the side surfaces 17a of the dents 17, and eventually, the flat n-contact layer 11 of n-GaN is formed on the sapphire substrate 10 (FIG. 2C). This n-contact layer 11 has an m-plane main surface, since the sapphire substrate 10 has an a-plane main surface, and the longitudinal direction of the dents 17 is the m-axis direction of the sapphire substrate 10.

Preferably, one of the two side surfaces 17a in the both sides of each dent 17 is covered with, for example, an SiO$_2$ mask, and then n-GaN crystal growth is carried out. This is because the thus-grown GaN has uniform polarity (i.e, +c or −c) along c-axis, and the n-contact layer 11 exhibits further improved crystallinity.

Figure 2D:
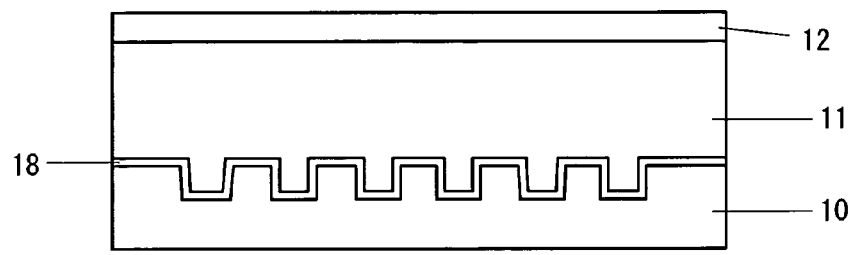

Subsequently, three InGaN well layers and three GaN barrier layers are alternately deposited on the n-contact layer 11 through MOCVD, to thereby form the light-emitting layer 12 (FIG. 2D). TMI (trimethylindium) is employed as an In source. The carrier gas, Ga source, and N source gas employed are the same as in the case of formation of the re-contact layer 11. The growth temperature is adjusted to 700 to 800° C., which is lower than the temperature employed for forming a light-emitting layer of a conventional Group III nitride semiconductor light-emitting device having a c-plane main surface. The reason for this is that In is less likely to be incorporated into an m-plane Group III nitride semiconductor, as compared with the case of a c-plane Group III nitride semiconductor. Reduction of the growth temperature suppresses deterioration of crystallinity.

Figure 2E:
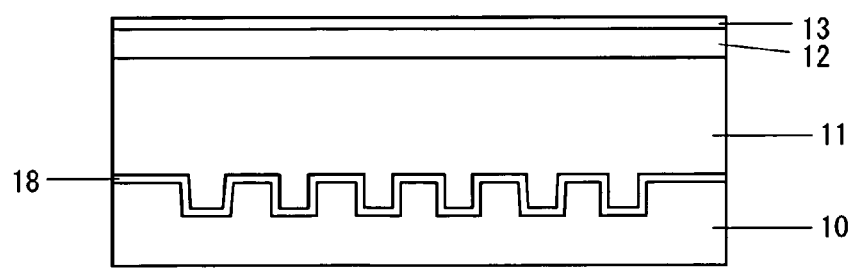

Next, the AlGaN electron blocking layer 13 (Mg content: 6 to $8\times10^{19}$ cm$^{-3}$, Al compositional proportion: 20 to 30%, thickness: 2 to 8 nm) is formed on the light-emitting layer 12 through MOCVD (FIG. 2E). TMA is employed as an Al source, and Cp$_2$Mg (biscyclopentadienylmagnesium) is employed as a p-type dopant source. The carrier gas, Ga source, and N source gas employed are the same as in the case of formation of the n-contact layer 11. The growth temperature is adjusted to 850 to 950° C.

Figure 2F:
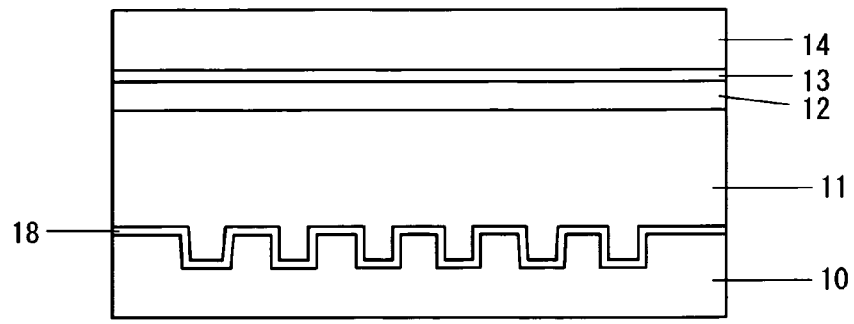

Subsequently, the GaN p-contact layer 14 (Mg content: $1\times10^{19}$ to $1\times10^{20}$ cm$^{-3}$) is formed on the electron blocking layer 13 through MOCVD (FIG. 2F). The carrier gas, Ga source, N source gas, and dopant gas employed are the same as in the case of formation of the electron blocking layer 13. The growth temperature is adjusted to 900 to 950° C. Since the light-emitting layer 12 is grown at a temperature lower than the temperature employed for growth of a light-emitting layer of a conventional Group III nitride semiconductor light-emitting device having a c-plane main surface, the p-contact layer 14 is also grown at a low temperature accordingly, so as to reduce damage to the light-emitting layer 12 and to improve emission performance.

Next, the p-electrode 15 is formed on a specific region of the p-contact layer 14 through the lift-off process. A portion of the p-contact layer 14 is subjected to dry etching, to thereby expose a portion of the n-contact layer 11. The n-electrode 16 is formed on the thus-exposed portion of the n-contact layer 11 through the lift-off process. These processes produce the light-emitting device 100 according to Embodiment 1 shown in FIG. 1.

Figure 3:
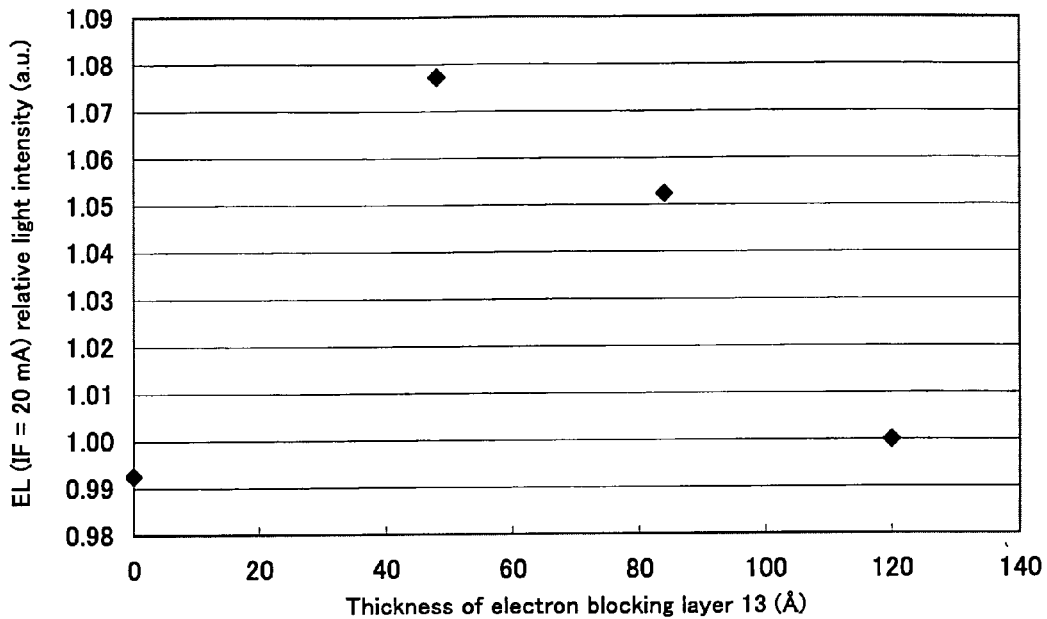
FIG. 3 is a graph showing the relationship between the thickness of an electron blocking layer 13 and emission intensity.

FIG. 3 is a graph showing the relationship between the thickness of the electron blocking layer 13 and emission intensity when the light-emitting device 100 is operated at 20 mA. The electron blocking layer 13 has an Al compositional proportion of 25% and is grown at a temperature of 910° C. Emission intensity (vertical axis) is normalized by taking, as 1, the emission intensity as measured in the case where the thickness of the electron blocking layer 13 is 120 Å. As is clear from FIG. 3, when the thickness of the electron blocking layer 13 is 50 Å or 80 Å, an emission intensity of 1.05 or more is obtained. As is also clear from FIG. 3, when the thickness of the electron blocking layer 13 is zero; i.e., when the electron blocking layer 13 is not provided, emission intensity is lowered to 0.99. Thus, as shown in FIG. 3, it is considered that the thickness of the electron blocking layer 13 is preferably 20 Å to 80 Å, most preferably 50 Å.

Figure 4:
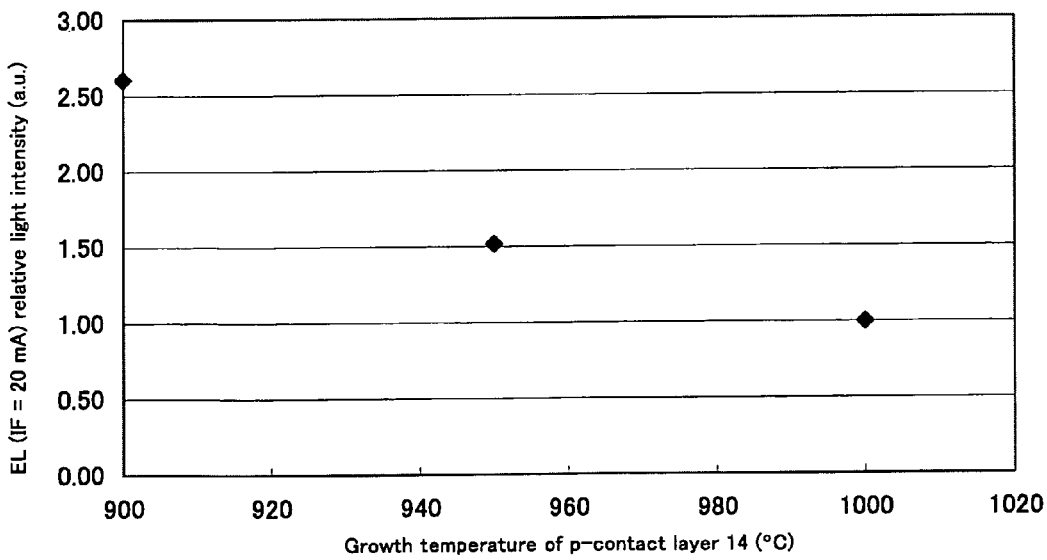
FIG. 4 is a graph showing the relationship between the growth temperature of a p-contact layer 14 and emission intensity.

FIG. 4 is a graph showing the relationship between the growth temperature of the p-contact layer 14 and emission intensity when the light-emitting device 100 is operated at 20 mA. Emission intensity is normalized by taking, as 1, the emission intensity as measured in the case where the p-contact layer 14 is grown at 1,000° C. As is clear from FIG. 4, emission performance improves as the growth temperature lowers, and the p-contact layer 14 is most preferably grown at about 900° C. This growth temperature is lower by 50° C. or more than the temperature employed for forming a p-contact layer of a conventional Group III nitride semiconductor light-emitting device having a c-plane main surface. Thus, emission performance can be improved by lowering the growth temperature of the p-contact layer 14. Conceivably, the reason for this is that since In is less likely to be incorporated into an m-plane Group III nitride semiconductor, the light-emitting layer 12 must be grown at a temperature lower than the temperature for growth of a light-emitting layer of a conventional Group III nitride semiconductor light-emitting device having a c-plane main surface. Conceivably, since the light-emitting layer 12 is grown at a low temperature, and the p-contact layer 14 is also grown at a low temperature accordingly, damage to the light-emitting layer 12 is reduced, and emission performance is considerably improved.

The configuration of the Group III nitride semiconductor light-emitting device is not limited to that described in the embodiment. For example, the light-emitting device may have a configuration in which an electrode is provided on the surface of an n-type layer exposed through removal of a growth substrate by, for example, the laser lift-off process, so that electrical conduction is achieved in a vertical direction.

In the aforementioned embodiment, an embossed sapphire substrate is employed as a growth substrate, and a Group III nitride semiconductor layer having an m-plane main surface is grown on the growth substrate. However, the growth substrate may be an m-plane GaN substrate.

Embodiment 1 describes the method for producing the Group III nitride semiconductor light-emitting device having an m-plane main surface by using an embossed a-plane sapphire substrate as a growth substrate. However, the present invention is not limited to this method. The present invention may also be applied to a method for producing, by using an embossed sapphire substrate as a growth substrate, another Group III nitride semiconductor light-emitting device whose main surface is a plane which provides an internal electric field of zero; i.e., a plane which is inclined by 90° with respect to c-plane (e.g., a-plane), or a plane which is inclined by about 60° with respect to c-plane (e.g., (11-22) plane). The main surface of such a light-emitting device may be a plane which is inclined by 5° or less with respect to m-plane, a-plane, or (11-22) plane. The main surface of such a light-emitting device is not necessarily a plane which provides an internal electric field of zero, and may be a plane which provides an internal electric field intensity of 10% or less that of a Group III nitride semiconductor layer having a c-plane main surface.

The Group III nitride semiconductor light-emitting device of the present invention can be employed in, for example, a display apparatus or an illumination apparatus.

What is claimed is:

1. A Group III nitride semiconductor light-emitting device including a stacked structure comprising an n-contact layer, a light-emitting layer, an electron blocking layer, and a p-contact layer, the layers being sequentially stacked and each of the layers comprising a Group III nitride semiconductor layer whose main surface represents a plane which provides an internal electric field intensity of 10% or less than that of a Group III nitride semiconductor layer including a c-plane main surface,
wherein the electron blocking layer has a thickness of 2 to 8 nm and comprises Mg-doped AlGaN having an Al compositional proportion of 20% to 30%,
wherein the stacked structure is deposited on an a-plane main surface of a sapphire substrate, and
wherein the n-contact layer, the light-emitting layer, and the electron blocking layer comprise an m-plane main surface, which is parallel to the a-plane main surface of the sapphire substrate.

2. A Group III nitride semiconductor light-emitting device according to claim 1, wherein the electron blocking layer has a thickness of 4 to 6 nm.

3. A Group III nitride semiconductor light-emitting device according to claim 2, which comprises the sapphire substrate including one embossed surface, wherein the stacked structure is provided on the embossed surface of the sapphire substrate.

4. A Group III nitride semiconductor light-emitting device according to claim 2, wherein a plurality of dents, arranged in a stripe pattern extending in an m-axis direction of the sapphire substrate which coincides with a longitudinal direction of the dents, are formed in parallel on the a-plane main surface of the sapphire substrate.

5. A Group III nitride semiconductor light-emitting device according to claim 4, wherein a thin AlN film is formed on the sapphire substrate.

6. A Group III nitride semiconductor light-emitting device according to claim 5, wherein the n-contact layer is grown on the thin AlN film formed on side surfaces of the dents.

7. A Group III nitride semiconductor light-emitting device according to claim 1, which comprises the sapphire substrate including one embossed surface,
wherein the stacked structure is provided on the embossed surface of the sapphire substrate.

8. A Group III nitride semiconductor light-emitting device according to claim 1, wherein a plurality of dents, arranged in a stripe pattern extending in an m-axis direction of the sapphire substrate which coincides with a longitudinal direction of the dents, are formed in parallel on the a-plane main surface of the sapphire substrate.

9. A Group III nitride semiconductor light-emitting device according to claim 8, wherein a thin AlN film is formed on the sapphire substrate.

10. A Group III nitride semiconductor light-emitting device according to claim 9, wherein the n-contact layer is grown on the thin AlN film formed on side surfaces of the dents.

11. A Group III nitride semiconductor light-emitting device according to claim 1, wherein a plurality of dents, arranged in a stripe pattern extending in an m-axis direction of the sapphire substrate, are formed in parallel on the a-plane main surface of the sapphire substrate.

12. A Group III nitride semiconductor light-emitting device according to claim 11, wherein a bottom surface of each of the dents is parallel to the a-plane main surface of the sapphire substrate.

13. A Group III nitride semiconductor light-emitting device according to claim 12, wherein a longitudinal direction of said each dent corresponds to the m-axis direction of the sapphire substrate.

14. A Group III nitride semiconductor light-emitting device according to claim 13, wherein a thin AlN film is disposed on an upper surface of the sapphire substrate.

15. A Group III nitride semiconductor light-emitting device according to claim 14, wherein the n-contact layer is disposed on the thin AlN film, the thin AlN film being disposed on side surfaces of the dents.

16. A Group III nitride semiconductor light-emitting device according to claim 14, wherein a thin AlN film is disposed on side surfaces of the dents.

17. A Group III nitride semiconductor light-emitting device according to claim 16, wherein the n-contact layer is disposed on the thin AlN film.

* * * * *